United States Patent
Bando et al.

[11] Patent Number: 6,011,220
[45] Date of Patent: *Jan. 4, 2000

[54] SEMICONDUCTOR PACKAGED DEVICE AND LEAD FRAME USED THEREIN

[75] Inventors: Ryujiro Bando, Tokyo; Seigo Ito, Soka; Masateru Saigusa, Funabashi, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/748,716

[22] Filed: Nov. 14, 1996

[30] Foreign Application Priority Data

Nov. 16, 1995 [JP] Japan ................... 7-298364

[51] Int. Cl.[7] .................................................. H01L 23/02
[52] U.S. Cl. .......................................... 174/52.4; 257/666
[58] Field of Search ................................ 174/52.4, 52.2, 174/260; 361/813; 257/676, 675, 670, 667, 666, 787; 437/220; 438/111, 123

[56] References Cited

U.S. PATENT DOCUMENTS

| | | |
|---|---|---|
| 4,862,245 | 8/1989 | Pashby et al. . |
| 5,146,312 | 9/1992 | Lim . |
| 5,289,033 | 2/1994 | Asami et al. . |
| 5,293,065 | 3/1994 | Chan et al. . |
| 5,334,803 | 8/1994 | Yamamura et al. . |
| 5,357,139 | 10/1994 | Yaguchi et al. . |
| 5,530,286 | 6/1996 | Murakami et al. . |
| 5,535,509 | 7/1996 | Tomita et al. ................ 29/827 |
| 5,548,160 | 8/1996 | Corbett et al. . |
| 5,550,401 | 8/1996 | Maeda et al. . |
| 5,585,600 | 12/1996 | Froebel et al. . |
| 5,635,756 | 6/1997 | Kohno et al. . |

FOREIGN PATENT DOCUMENTS

| | | | |
|---|---|---|---|
| 86724 | 8/1983 | European Pat. Off. | ........... 257/675 |
| 361053752 | 3/1986 | Japan | ........... 257/675 |

*Primary Examiner*—Dean A. Reichard
*Assistant Examiner*—Hung V Ngo
*Attorney, Agent, or Firm*—Finnegan, Henderson, Farabow, Garrett & Dunner, L.L.P.

[57] ABSTRACT

In a semiconductor packaged device of an LOC structure, a lead frame is formed having leads which extend in two directions from a semiconductor chip. The lead frame further includes dummy frames which extend in the two directions opposite of the directions in which the leads extend. The dummy frames are located below the center line (drawn half-way between the upper surface and undersurface of the device) by depressing the dummy frames before the semiconductor chip is mounted on the lead frame. The inner lead portions of the leads are each adhered to the surface of the semiconductor chip through a tape and connected to electrode pads on the semiconductor chip using bonding wires. The semiconductor chip and its periphery is then sealed with mold resin.

11 Claims, 3 Drawing Sheets

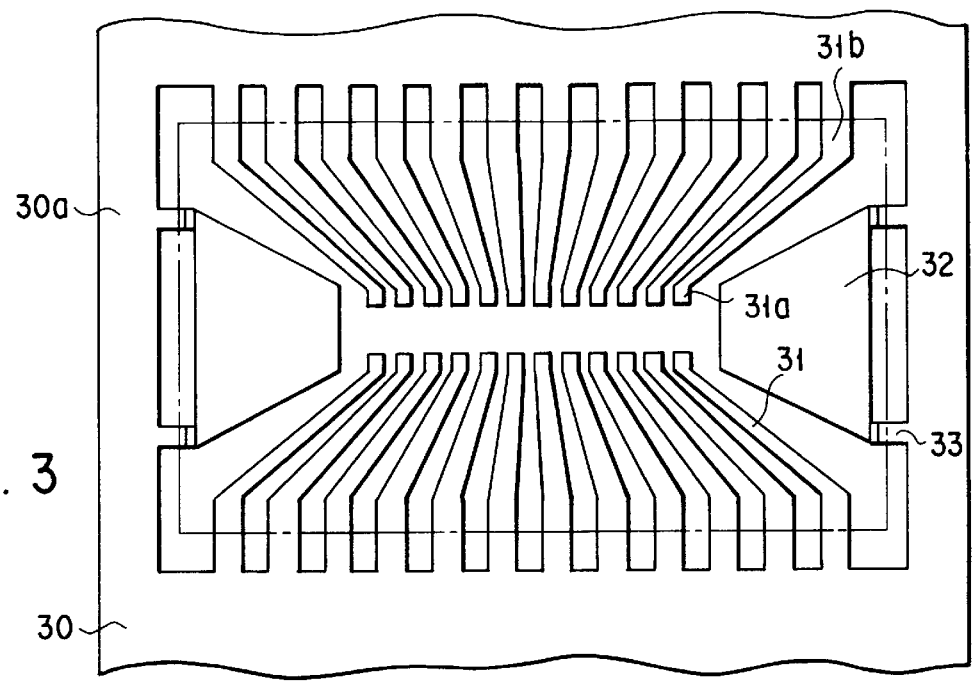
FIG. 3
| | THICKNESS OF RESIN ABOVE LEAD | | | | |
|---|---|---|---|---|---|
| | 150 | 160 | 170 | 180 | 190 |
| PRESENT INVENTION | 38 | 27 | 18 | 11 | 16 |
| PRIOR ART | 57 | 46 | 39 | 32 | 28 |
FIG. 4
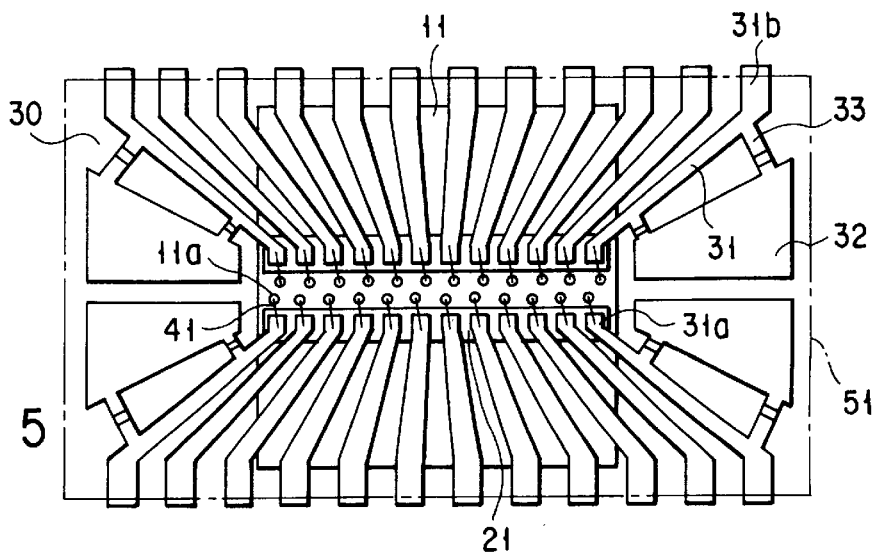
FIG. 5

SEMICONDUCTOR PACKAGED DEVICE AND LEAD FRAME USED THEREIN

BACKGROUND OF THE INVENTION

1. Field of the Invention

The present invention relates to a semiconductor packaged device and a lead frame for use within the semiconductor packaged device. More particularly, the present invention relates to a semiconductor packaged device using a lead frame in which the leads of the lead frame extend in two directions from a semiconductor chip.

2. Description of the Related Art

Recently, there has developed a high demand for semiconductor packaged memory devices having increased density and functions. In addition, the demand is also great for developing devices which have a plurality of memory regions (i.e., value added or multi-bit devices). However, as the density and function of the device is increased and as more memories are added, the size of the memory chip is likely to increase as well. One way to avoid such an increase in the size of a packaged memory device is to use, for example, an LOC (lead on chip) structure.

FIGS. 1A and 1B illustrate a prior art semiconductor packaged memory device adopting an LOC structure. FIG. 1A is a plan view showing the inside of the semiconductor packaged device, while FIG. 1B is a cross-sectional view taken along the line IB—IB of FIG. 1A.

As illustrated in FIG. 1A, leads 3 of a lead frame are adhered to the surface of a semiconductor chip 1 by a tape 2. The chip 1 may comprise, for example, a center pad structure. Each of the leads 3 has an inner lead portion 3a which is connected to a respective electrode pad 1a by a corresponding bonding wire 4. The semiconductor chip 1 and its outer periphery is then sealed in mold resin 5.

The resin, however, is less able to fill the area above the chip 1 where the leads 3 are formed than it is able to fill the area under the chip 1. Thus it has been necessary to increase the amount of resin in the area above the chip 1. The problem with this approach is that the device becomes easily warped. The warping of the device will occur because the thickness of the resin above the chip, as compared to the resin thickness below it, will be different.

This problem particularly concerns a multi-bit memory having a plurality of memory regions since it has a larger number of leads, as compared to a single-bit memory. For instance, as shown in FIGS. 1A and 1B, the semiconductor packaged device having a multi-bit memory may be constructed such that the leads 3 have outer lead portions 3b extending in two opposing directions from the semiconductor chip 1. The mold resin 5 will then be considerably thicker in each of these directions where the chip 1 is not present. Furthermore, the warp will vary in shape between the area in the mold resin 5 where the chip 1 is present and that area where the chip 1 is not present. This variation in the warp occurs because the thickness of the mold resin 5 will be different for these two areas.

More specifically, in the area where the chip 1 is present, the resin under the chip 1 will be thinner than that above it. Thus, the resin above the chip will contract more when the resin hardens, causing the packaged device to warp concavely. In the area where the chip 1 is not present, on the other hand, the leads 3 will be formed above the center line CL (drawn half-way between the upper surface and undersurface of the packaged device). Thus, the resin under the leads 3 will contract more when the resin hardens, causing the device to warp convexly. Therefore, these different warps will cause cracking in the semiconductor packaged device which is unfavorable for its manufacture.

As described above, the prior art semiconductor packaged device has the drawback that warping easily occurs when an LOC structure is used to reduce the size of the packaged device. Therefore, it is an object of the present invention to provide a semiconductor packaged device, having an LOC structure and using a lead frame, which is capable of decreasing a warp.

SUMMARY OF THE INVENTION

Accordingly, the present invention is directed to a semiconductor packaged device, and a lead frame used within the device, that substantially obviates one or more of the problems due to limitations and disadvantages of the prior art.

To achieve the above objects and in accordance with the purpose of the invention, as embodied and broadly described, there is provided a lead frame for use within a semiconductor packaged device having an LOC (lead on chip) structure. The lead frame comprises a plurality of lead terminals extending in two opposing directions from a semiconductor chip. Also included are dummy frames extending in two opposing directions from the semiconductor chip which are different from the directions in which the plurality of lead terminals extend.

There is also provided a semiconductor packaged device having an LOC (lead on chip) structure. The packaged device comprises a semiconductor chip having a plurality of electrode pads on a surfaces of the semiconductor chip. Also included is a lead frame which further includes a plurality of lead terminals extending in two opposing directions from the semiconductor chip. The plurality of lead terminals each have an inner lead portion connected to a corresponding electrode pad on the semiconductor chip and an outer lead portion extending in a direction away from the semiconductor chip. The lead frame also includes dummy frames extending in two opposing directions from the semiconductor chip which are different from the directions in which the plurality of lead terminals extend. Finally, a sealing material is included for sealing a periphery of the semiconductor chip. This periphery includes at least the dummy frames and the inner lead portions of each of the plurality of lead terminals.

There is further provided a method for manufacturing a semiconductor packaged device. The method comprises the step of forming a lead frame from a single, flat, thin, metal plate. The lead frame includes a plurality of lead terminals extending in two opposing directions from a semiconductor chip. The lead frame also includes dummy frames extending in two opposing directions from the semiconductor chip which are different from the directions in which the plurality of lead terminals extend. The dummy frames of the lead frame are then bent at positions of hanging pins such that the dummy frames will be located below a center line located half-way between an upper surface and a lower surface of the semiconductor packaged device. Next, the inner lead portions of the plurality of lead terminals are adhered to a surface of the semiconductor chip. The inner lead portions of the plurality of lead terminals are then connected to electrode pads located on the semiconductor chip. Finally, the semiconductor chip, with the lead frame mounted thereon, are sealed within a sealing material.

Additional objects and advantages of the invention will be set forth in the description which follows, and in part will be obvious from the description, or may be learned by practice of the invention. The objects and advantages of the invention may be realized and attained by the apparatus and process particularly pointed out in the written description and claims hereof, as well as the appended drawings.

BRIEF DESCRIPTION OF THE DRAWINGS

The accompanying drawings, which are incorporated in and constitute a part of the specification, illustrate embodiments of the invention and, together with the description, serve to explain the objects, advantages, and principles of the invention. In the drawings:

FIG. 3 is a plan view illustrating a lead frame used in the device of FIGS. 2A and 2B;

FIG. 4 is a table comparing the amount of warp in the semiconductor packaged device constructed in accordance with the present invention to the warp in the prior art device; and FIG. 5 is an illustration of a semiconductor packaged device according to a second embodiment of the present invention.

DETAILED DESCRIPTION OF THE PREFERRED EMBODIMENTS

Embodiments of the present invention will now be described with reference to the accompanying drawings.

Figure 1A:
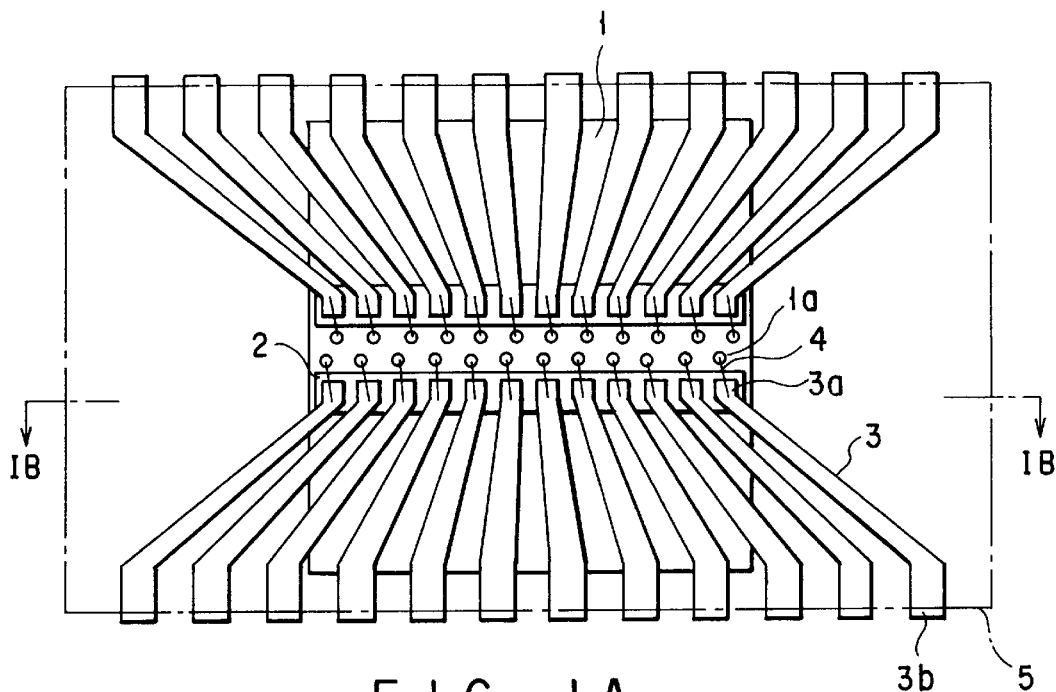
FIG. 1A is an illustration of a prior art semiconductor packaged device.
Figure 1B:
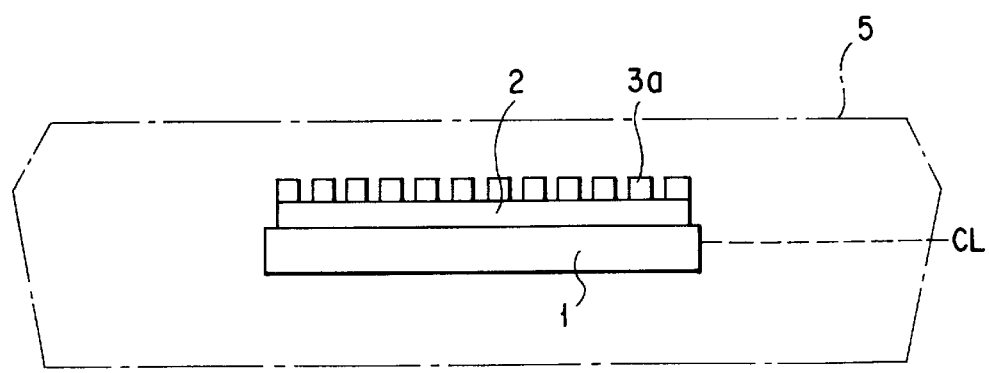
FIG. 1B is a cross-sectional view taken along the line IB—IB of FIG. 1A.
Figure 2A:
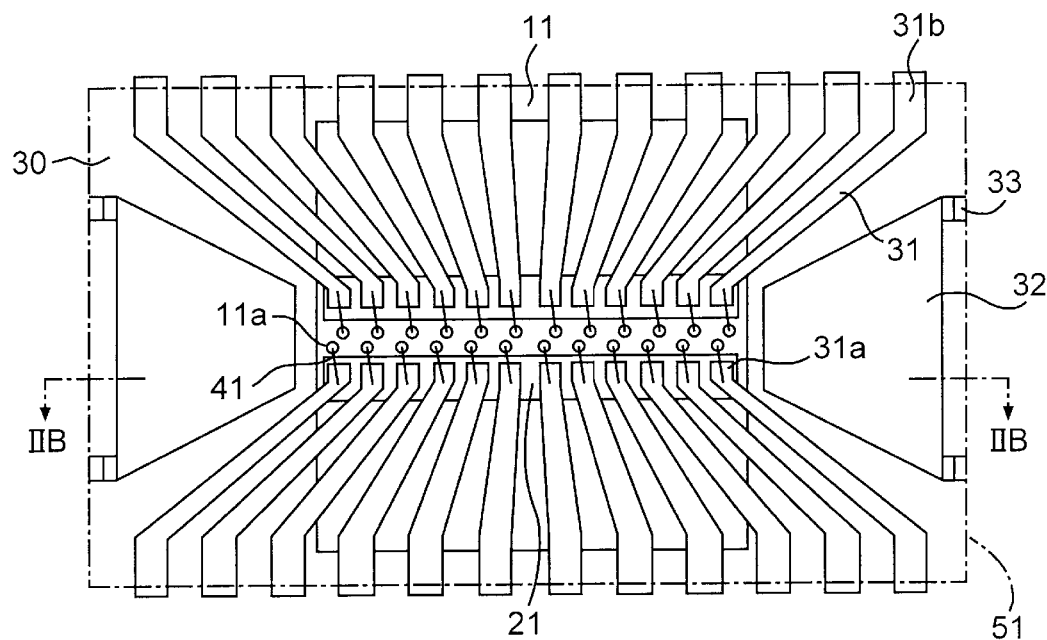
FIG. 2A is an illustration of a semiconductor packaged device according to a first embodiment of the present invention.
Figure 2B:
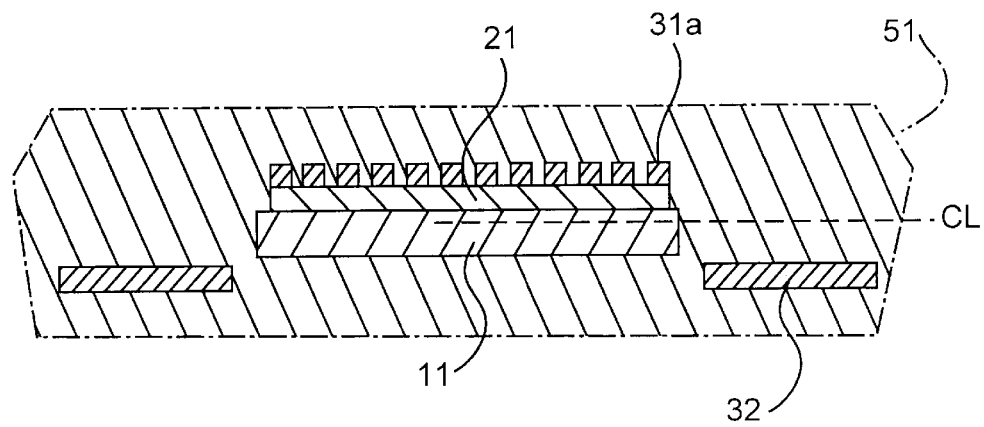
FIG. 2B is a cross-sectional view taken along the line IIB—IIB of FIG. 2A.

FIGS. 2A and 2B illustrate a semiconductor packaged device having an LOC (lead on chip) structure according to a first embodiment of the present invention. The device includes a lead frame 30 having leads 31 which extend in two direction from a semiconductor chip 11.

As shown in FIG. 2A, leads 31 of a lead frame 30 are adhered to the surface of the semiconductor chip 11 by a tape 21. The leads 31 have inner lead portions 31a connected to respective electrode pads 11a, located on the surface of the chip 11, by corresponding bonding wires 41. The semiconductor chip 11 and its periphery (i.e., the attached lead frame assembly) are then sealed in mold resin 51. The leads 31 include outer lead portions 31b which extend outward to the circumference of the mold resin 51 in two opposing directions from the semiconductor chip 11. In addition, the outer lead portions 31b are each formed so as to have a predetermined shape.

The semiconductor packaged device further includes trapezoidal dummy frames 32. The dummy frames 32 are formed in the areas of the mold resin 51 where neither the chip 11 nor the leads 31 are formed. Each of the dummy frames 32 is bent downward by depressing the dummy frames 32 at the positions of hanging pins 33. This bending causes the dummy frames 32 to be located at least below the center line CL (drawn half-way between the upper surface and undersurface of the packaged device). By placing the dummy frames at this location, the warping of the device will be offset.

The semiconductor chip 11 is of a type having a substantially square memory and a capacity of about 16 Mbits. In addition, the chip 11 has a center pad structure and has a plurality of electrode pads 11a arranged in a staggered fashion along a center line of the chip's surface.

The lead frame 30 is formed into its predetermined shape by etching or punching a metal thin plate. The lead frame 30 includes both the leads 31, which extend in the two opposing directions from the chip 11, and the trapezoidal dummy frames 32. Furthermore, the dummy frames 32 extend in the two opposing directions where none of the leads are present.

FIG. 3 illustrates the lead frame 30, in its pre-assembly stage, according to the first embodiment of the present invention. The lead frame 30 is constituted by forming the leads 31 and dummy frames 32 from a single, long, flat, thin, metal plate such that they are both integrated into one component. The inner lead portions 31a of the leads 31 are attached to corresponding electrode pads 11a on the semiconductor chip 11 by the bonding wires 41. The outer lead portions 31b., on the other hand, are supported by two opposing sides of a periphery member 30a of the lead frame 30.

The dummy frames 32 are supported by the periphery member 30a through the use of hanging pins 33. As shown in FIG. 3, the dummy frames 32 are bent downward by depressing the frame 30 at the positions of the hanging pins 33. The bending of the dummy frames 32 can be done either after the lead frame is formed or before the package is assembled.

A process of manufacturing the above-described semiconductor packaged device will now be briefly described. First, a metal thin plate is etched or punched into a lead frame 30 having a predetermined shape. The lead frame 30 includes the leads 31 and the dummy frames 32. The leads 31 are formed by taking into account design considerations such as the size of the semiconductor chip 11 and the number and positions of the electrode pads 11a. The dummy frames 32 are provided in areas of the mold resin 51 where none of the leads 31 are present. In addition, the dummy frames 32 extend in the two opposing directions from the chip 11 which are opposite of the directions in which the leads 31 extend.

The dummy frames 32 are bent at positions of the hanging pins 33 such that they are located below the center line CL. Next, the inner lead portions 31a of the leads 31 are adhered to the surface of the semiconductor chip 11 by a tape 21. Bonding wires 41 are then used to connect the inner lead portions 31a to the electrode pads 11a on the semiconductor chip 11. The chip 11 and lead frame 30 assembly is then placed between two molds (not shown), and resin is injected into the molds in order to seal the assembly. The resin is hardened by heat, or the like, to form a mold resin 51.

In the area of the mold resin where the semiconductor chip 11 is not present, the leads 31 are located above the center line CL, while the dummy frames 32 are located below the line CL. The result is that the dummy frames 32 will offset a warp caused in the area of the mold resin 51 where the chip is not present. In other words, in the area of the mold resin 51 where the chip 11 is not present, the dummy frames 32 effectively decrease the large difference in thickness between the resin above the leads 31 as compared to that under the leads 31. This arrangement prevents a severe warp from occurring due to a difference in resin thickness between the area where the chip 11 is present and the area where it is not present.

After the mold resin 51 is completely hardened, the mold is removed and the periphery member 30a is cut off from the outer lead portions 31b. This completes the manufacturing of the semiconductor packaged device, which is shown in its completed form in FIGS. 2A and 2B.

FIG. 4 shows the results of a simulation for comparing the warp which occurs in the semiconductor packaged device constructed in accordance with the present invention to the warp which occurs in the prior art device. In this simulation, the following parameters were used: the thickness of the semiconductor chip is 290.0 µm; the thickness of the tape is 87.5 µm; the thickness of a lead is 125.0 µm; the difference in height between the leads and the dummy frames is 340 µm; and the thickness of the mold resin is 1.0 mm. FIG. 4 shows the differences between the highest and the lowest levels of the devices (the amount of warp) when the thickness above the resin on the leads is set to 150µm, 160µm, 170µm, 180 µm or 190 µm.

It is clear from the results shown in FIG. 4 that, at all values of resin thickness, the amount of warp in the device constructed in accordance with the present invention is smaller than that in the prior art. As described above, in the area of the semiconductor packaged device where the chip is not present, the warp which occurs can be offset by using the device of the present invention.

This is particularly advantageous for a semiconductor packaged device having an LOC structure, wherein a lead frame includes leads extending in two directions from the chip. In this case, trapezoidal dummy frames are formed in the area of the mold resin where the chip is not present. This allows a large difference in thickness between the resin above the leads as compared to that under the leads, to be effectively decreased. As a consequence, a severe warp is prevented from occurring, in the above case, when the dummy frames are located below the center line CL. In addition, it is particularly effective to symmetrically arrange the dummy frames and the leads in relation to the center line CL. This is advantageous because the resin thickness above and under the leads can be effectively equal to each other in the area where the semiconductor chip is not present. The present invention is also advantageous if it is applied to a multi-bit memory device having a number of leads, and wherein the memory chip's predetermined memory capacity is divided into a plurality of regions, each of which can be driven individually.

According to the first embodiment described above, each of the dummy frames is supported by the frame through the use of the hanging pins. The present invention, however, is not limited to this embodiment. For example, each of the dummy frames can be supported by a corresponding outermost one of the plural leads by the use of hanging pins.

FIG. 5 schematically shows a semiconductor packaged device according to a second embodiment of the present invention. In FIG. 5, each of the dummy frames 32 is supported by the corresponding outermost lead 31 of the lead frame 30 through the use of hanging pins 33. The dummy frames 32 are bent downward by depressing at the positions of the pins 33, causing the frames 32 to be located below the center line CL. Therefore, a warp is decreased by using the second embodiment of the present invention.

In the second embodiment, each dummy frame 32 is divided into two dummy frames and are each supported by the outermost lead 31 by the hanging pins 33. However, as in the first embodiment, the dummy frame 32 can be used without being divided into two frames when the two outermost leads 31 process a common signal such as a power supply. Similarly, the dummy frames of the first embodiment can be divided into a plurality of frames as shown in the second embodiment.

It will be apparent to those skilled in the art that various modifications and variations can be made to the semiconductor packaged device and lead frame of the present invention without departing from the spirit or scope of the invention. Thus, it is intended that the present invention cover the modifications and variations of this invention provided they come within the scope of the appended claims and their equivalents.

What is claimed is:

1. A semiconductor packaged device having a lead on chip (LOC) structure, the device comprising:

a semiconductor chip having a plurality of electrode pads on a surface of the semiconductor chip;

a lead frame including a plurality of lead terminals extending along a first plane in two opposing directions from the semiconductor chip, and wherein the plurality of lead terminals each has an inner lead portion coupled to a corresponding one of the plurality of electrode pads on the semiconductor chip and an outer lead portion extending in a direction away from the semiconductor chip, the lead frame also including dummy frames extending along a second plane in two opposing directions from the semiconductor chip different from the directions in which the plurality of lead terminals extend, wherein the first plane and the second plane are at different levels; and a sealing material for sealing a periphery of the semiconductor chip with the lead frame mounted thereon, at least the dummy frames, and the inner lead portion of each of the plurality of lead terminals, wherein the dummy frames are surrounded by the sealing material on all sides; and further wherein the first plane along which the lead terminals extend is substantially parallel to the second plane along which the dummy frames extend.

2. The device of claim 1, the lead frame further including:

a periphery member and hanging pins extending from the periphery member, wherein the hanging pins are bent downward such that the hanging pins support the dummy frames at a position below a center line located halfway between an upper surface and a lower surface of the sealing material.

3. The device of claim 1, the lead frame further including:

hanging pins extending from one of the plurality of lead terminals, wherein the hanging pins are bent downward such that the hanging pins support the dummy frames at a position below a center line located halfway between an upper surface and a lower surface of the sealing material.

4. The device of claim 1, wherein each dummy frame that extends in each opposing direction is a single dummy frame portion.

5. The device of claim 1, wherein each dummy frame that extends in each opposing direction comprises a plurality of dummy frame portions.

6. A semiconductor packaged device comprising:

a semiconductor chip having a plurality of electrode pads on a surface of the semiconductor chip;

a lead frame mounted on the semiconductor chip, including a plurality of lead terminals extending along a first plane in two opposing directions from the semiconductor chip, and wherein the plurality of lead terminals each has an inner lead portion coupled to a corresponding one of the plurality of electrode pads on the semiconductor chip and an outer lead portion extending in a direction away from the semiconductor chip, the lead frame also including dummy frames extending along a second plane in two opposing directions from the semiconductor chip different from the directions in which the plurality of lead terminals extend, wherein the first plane and the second plane are at different levels;

a sealing material for sealing a periphery of the semiconductor chip, at least the dummy frames, and the inner lead portions of each of the plurality of lead terminals, wherein the dummy frames are surrounded by the sealing material on all sides;

wherein the first plane along which the lead terminals extend is substantially parallel to the second plane along which the dummy frames extend;

the first plane located at a first distance above a center line located halfway between an upper surface and a lower surface of the sealing material; and the second plane located at a second distance below the center line, and wherein the second distance is substantially equal to the first distance.

7. The device of claim 6, the lead frame further including:

a periphery member and hanging pins extending from the periphery member, wherein the hanging pins are bent downward such that the hanging pins support the dummy frames at a position below the center line located halfway between an upper surface and the lower surface of the sealing material.

8. The device of claim 6, the lead frame further including:

hanging pins extending from one of the plurality of lead terminals, wherein the hanging pins are bent downward such that the hanging pins support the dummy frames at a position below the center line located halfway between the upper surface and the lower surface of the sealing material.

9. The device of claim 6, wherein each dummy frame that extends in each opposing direction is a single dummy frame portion.

10. The device of claim 6, wherein each dummy frame that extends in each opposing direction comprises a plurality of dummy frame portions.

11. A method for manufacturing a semiconductor packaged device having a lead on chip (LOC) structure, the method comprising the steps of:

forming a lead frame from a single, flat, thin, metal plate, wherein the lead frame includes a plurality of lead terminals, each having an inner lead portion and extending along a first plane in two opposing directions from a semiconductor chip, and also includes dummy frames extending along a second plane in two opposing directions from the semiconductor chip, which are different from the directions in which the plurality of lead terminals extend, wherein the first plane and the second plane are at different levels;

bending the dummy frames of the lead frame at positions of hanging pins such that the hanging pins support the dummy frames in a position along the second plane and such that the first plane along which the lead terminals extend is substantially parallel to the second plane along which the dummy frames extend;

adhering the inner lead portion of each of the plurality of lead terminals to a surface of the semiconductor chip, with the lead frame mounted thereon;

coupling the inner lead portions of the plurality of lead terminals respectively to electrode pads located on the semiconductor chip; and sealing the semiconductor chip, with the lead frame mounted thereon, within a sealing material such that the dummy frames are surrounded by the sealing material on all sides.

* * * * *

UNITED STATES PATENT AND TRADEMARK OFFICE
CERTIFICATE OF CORRECTION

PATENT NO.  : 6,011,220
DATED       : January 4, 2000
INVENTOR    : Ryujiro BANDO et al.

It is certified that error appears in the above-identified patent and that said Letters Patent is hereby corrected as shown below:

Claim 7, Col. 7, line 27, "an upper" should read --the upper--.

Signed and Sealed this

Sixth Day of March, 2001

Attest:

NICHOLAS P. GODICI

Attesting Officer          Acting Director of the United States Patent and Trademark Office